(12) United States Patent
Sui et al.

(10) Patent No.: US 12,029,097 B2
(45) Date of Patent: Jul. 2, 2024

(54) DISPLAY PANEL, METHOD FOR MANUFACTURING THE SAME AND DISPLAY DEVICE

(71) Applicant: BOE Technology Group Co., Ltd., Beijing (CN)

(72) Inventors: Kai Sui, Beijing (CN); Jingkai Ni, Beijing (CN); Zhongyuan Sun, Beijing (CN); Qian Jin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 412 days.

(21) Appl. No.: 17/430,673

(22) PCT Filed: Feb. 26, 2021

(86) PCT No.: PCT/CN2021/078101
§ 371 (c)(1),
(2) Date: Aug. 12, 2021

(87) PCT Pub. No.: WO2021/170079
PCT Pub. Date: Sep. 2, 2021

(65) Prior Publication Data
US 2023/0157135 A1    May 18, 2023

(30) Foreign Application Priority Data

Feb. 28, 2020 (CN) .......................... 202010127827.4

(51) Int. Cl.
*H10K 59/80* (2023.01)
*H10K 59/60* (2023.01)
*H10K 71/00* (2023.01)

(52) U.S. Cl.
CPC .......... *H10K 59/873* (2023.02); *H10K 59/60* (2023.02); *H10K 59/8792* (2023.02); *H10K 71/00* (2023.02)

(58) Field of Classification Search
CPC ............. H10K 59/873; H10K 59/1201; H10K 59/8792; H10K 59/12; H10K 59/38; H10K 59/60; H10K 71/00; H10K 50/844
See application file for complete search history.

(56) References Cited

U.S. PATENT DOCUMENTS

2015/0249119 A1* 9/2015 In .......................... H10K 59/124
257/40
2018/0151630 A1    5/2018 Yamaoka et al.
(Continued)

FOREIGN PATENT DOCUMENTS

CN    107464529 A    12/2017
CN    108345142 A    7/2018
(Continued)

OTHER PUBLICATIONS

CN 202010127827.4 first office action.
PCT/CN2021/078101 International search report and written opinion.

*Primary Examiner* — Joshua L Schwartz
*Assistant Examiner* — Tiberiu Dan Onuta
(74) *Attorney, Agent, or Firm* — IPro, PLLC (57) ABSTRACT

The present disclosure provides a display panel, a method for manufacturing the display panel, and a display device. The display panel includes: a light-emitting module including an electroluminescent element and a thin film encapsulation layer for encapsulating the electroluminescent element arranged on a first substrate sequentially; a quantum dot module including a plurality of quantum dot light-emitting units spaced apart from each other; and a second substrate located between the light-emitting module and the quantum dot module, and configured to support the quantum dot module at a side of the light-emitting module away from the first substrate. An orthogonal projection of the thin film encapsulation layer onto the first substrate is located within (Continued)

an orthogonal projection of the second substrate onto the first substrate.

14 Claims, 5 Drawing Sheets

(56) References Cited

U.S. PATENT DOCUMENTS

| | | |
|---|---|---|
| 2018/0210280 A1 | 7/2018 | Chen et al. |
| 2020/0219935 A1* | 7/2020 | Ahn ................... H10K 59/122 |
| 2020/0381599 A1* | 12/2020 | Kuo ....................... H01L 33/56 |
| 2021/0231565 A1 | 7/2021 | Meng et al. |

FOREIGN PATENT DOCUMENTS

| | | |
|---|---|---|
| CN | 108365133 A | 8/2018 |
| CN | 109087935 A | 12/2018 |
| CN | 110021652 A | 7/2019 |
| CN | 110690364 A | 1/2020 |
| CN | 110823845 A | 2/2020 |
| CN | 111312785 A | 6/2020 |

* cited by examiner

DISPLAY PANEL, METHOD FOR MANUFACTURING THE SAME AND DISPLAY DEVICE

CROSS-REFERENCE TO RELATED APPLICATION

The present application is the U.S. national phase of PCT Application No. PCT/CN2021/078101 filed on Feb. 26, 2021, which claims a priority of the Chinese patent application No. 202010127827.4 filed on Feb. 28, 2020, which is incorporated herein by reference in its entirety.

TECHNICAL FIELD

The present disclosure relates to the field of display technology, in particular to a display panel, a method for manufacturing the display panel, and a display device.

BACKGROUND

Along with the development of the display manufacturing technology, a display device has been widely used, and plays an indispensable role in our work and lives. Currently, a Quantum Dot Light-Emitting Diode (QLED) display device has become more and more popular due to such advantages as wide color gamut, high color purity and high color reproduction capability.

In the related art, usually Organic Light-Emitting Diode (OLED) is used to excite a quantum dot light-emitting unit to emit colored light. However, when a quantum dot module is pressed against a light-emitting module, an encapsulation film layer of the light-emitting module may be damaged, and the OLED may be easily eroded by moisture and oxygen, leading to an imperfect display effect of the quantum dot display device.

SUMMARY

In a first aspect, the present disclosure provides in some embodiments a display panel, including: a light-emitting module including an electroluminescent element and a thin film encapsulation layer for encapsulating the electroluminescent element arranged on a first substrate sequentially; a quantum dot module including a plurality of quantum dot light-emitting units spaced apart from each other; and a second substrate located between the light-emitting module and the quantum dot module, and configured to support the quantum dot module at a side of the light-emitting module away from the first substrate. An orthogonal projection of the thin film encapsulation layer onto the first substrate is located within an orthogonal projection of the second substrate onto the first substrate.

In a possible embodiment of the present disclosure, the display panel further includes a retaining wall located between the first substrate and the second substrate, and configured to enclose the light-emitting module.

In a possible embodiment of the present disclosure, the display panel further includes an optically clear adhesive configured to fill a gap among the retaining wall, the light-emitting module and the second substrate.

In a possible embodiment of the present disclosure, the quantum dot module further includes optical sensors electrically coupled to sensing lines and each configured to detect an intensity of light emitted by a corresponding quantum dot light-emitting unit, and the intensity of the light is used as a basis for compensating for a luminous intensity of the electroluminescent element corresponding to the optical sensor.

In a possible embodiment of the present disclosure, an orthogonal projection of the optical sensor onto the first substrate partially overlaps an orthogonal projection of the quantum dot light-emitting unit onto the first substrate.

In a possible embodiment of the present disclosure, the quantum dot light-emitting units include a red quantum dot light-emitting unit, a green quantum dot light-emitting unit and a blue quantum dot light-emitting unit. A width of an overlapping region between an orthogonal projection of the red quantum dot light-emitting unit onto the first substrate and the orthogonal projection of the corresponding optical sensor onto the first substrate along a row direction of the electroluminescent element is larger than a width of an overlapping region between an orthogonal projection of the green quantum dot light-emitting unit onto the first substrate and the orthogonal projection of the corresponding optical sensor onto the first substrate along the row direction of the electroluminescent element; and/or a width of an overlapping region between an orthogonal projection of the blue quantum dot light-emitting unit onto the first substrate and the orthogonal projection of the corresponding optical sensor onto the first substrate along the row direction of the electroluminescent element is larger than the width of the overlapping region between the orthogonal projection of the green quantum dot light-emitting unit onto the first substrate and the orthogonal projection of the corresponding optical sensor onto the first substrate along the row direction of the electroluminescent element.

In a possible embodiment of the present disclosure, a black matrix is provided between adjacent quantum dot light-emitting units.

In a possible embodiment of the present disclosure, the quantum dot module further includes a plurality of supporting structures, each supporting structure is located between a corresponding black matrix and the second substrate to define an accommodation space between the corresponding black matrix and the second substrate, and a corresponding optical sensor is located in the accommodation space.

In a possible embodiment of the present disclosure, the quantum dot module further includes a plurality of light-shielding structures, each light-shielding structure is located between the corresponding supporting structure and the second substrate, each optical sensor is arranged at a side of the corresponding light-shielding structure away from the light-emitting module, and an orthogonal projection of the optical sensor onto the first substrate is located within an orthogonal projection of the corresponding light-shielding structure onto the first substrate.

In a possible embodiment of the present disclosure, the quantum dot module further includes a plurality of supporting structures, each supporting structure is located at a side of a corresponding black matrix away from the second substrate to define an accommodation space at the side of the corresponding black matrix away from the second substrate, and a corresponding optical sensor is located in the accommodation space.

In a possible embodiment of the present disclosure, the quantum dot module further includes a plurality of light-shielding structures, each light-shielding structure abuts against a surface of a corresponding supporting structure away from the second substrate, each optical sensor is arranged at a side of the corresponding light-shielding structure close to the second substrate, and an orthogonal projection of the optical sensor onto the first substrate is within an orthogonal projection of the corresponding light-shielding structure onto the first substrate.

In a possible embodiment of the present disclosure, the supporting structure is made of a black material.

In a possible embodiment of the present disclosure, an anti-crosstalk structure is further provided at a side of the second substrate close to the first substrate, and an orthogonal projection of a gap between two adjacent quantum dot light-emitting units onto the first substrate is located within an orthogonal projection of the anti-crosstalk structure onto the first substrate.

In a second aspect, the present disclosure provides in some embodiments a method for manufacturing a display panel, including: providing a first substrate, and sequentially forming an electroluminescent element and a thin film encapsulation layer on the first substrate; providing a second substrate, and forming a quantum dot module on the second substrate, the quantum dot module including a plurality of quantum dot light-emitting units spaced apart from each other; and encapsulating the second substrate onto the thin film encapsulation layer. An orthogonal projection of the thin film encapsulation layer onto the first substrate is located within an orthogonal projection of the second substrate onto the first substrate.

In a possible embodiment of the present disclosure, the forming the quantum dot module on the second substrate includes: forming light-shielding structures on the second substrate; forming optical sensors and supporting structures at a side of each light-shielding structure away from the second substrate, an orthogonal projection of each optical sensor onto the first substrate and an orthogonal projection of each supporting structure onto the first substrate not overlapping each other and being located within an orthogonal projection of the corresponding light-shielding structure onto the first substrate; forming a black matrix at a side of each supporting structure away from the second substrate; and forming each quantum dot light-emitting unit between two adjacent black matrices, an orthogonal projection of each quantum dot light-emitting unit onto the first substrate partially overlapping the orthogonal projection of the corresponding optical sensor onto the first substrate.

In a possible embodiment of the present disclosure, the forming the quantum dot module on the second substrate includes: forming black matrices and the quantum dot light-emitting units each located between two adjacent black matrices on the second substrate; providing a third substrate, and forming light-shielding structures on the third substrate; forming an optical sensor and a supporting structure at a side of each light-shielding structure away from the third substrate, an orthogonal projection of the optical sensor onto the third substrate and an orthogonal projection of the supporting structure onto the third substrate not overlapping each other and being located within an orthogonal projection of the corresponding light-shielding structure onto the third substrate; and encapsulating the third substrate at a side of each quantum dot light-emitting unit away from the second substrate, the optical sensors, the supporting structures and the light-shielding structures being located between the third substrate and the second substrate, and an orthogonal projection of each quantum dot light-emitting unit onto the second substrate partially overlapping the orthogonal projection of the corresponding optical sensor onto the second substrate.

In a third aspect, the present disclosure provides in some embodiments a display device, including the above-mentioned display panel.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Obviously, the following drawings merely relate to some embodiments of the present disclosure, and based on these drawings, a person of ordinary skill in the art may obtain other drawings without any creative effort.

REFERENCE SIGN LIST 110 light-emitting module
111 electroluminescent element
111A anode
111B cathode
111C light-emitting layer
111D pixel definition layer
112 thin film encapsulation layer
113 thin film transistor array layer
120 first substrate
130 quantum dot module
131 quantum dot light-emitting unit
132 color filter layer
133 optical sensor
134 black matrix
135 supporting structure
136 light-shielding structure
137 anti-crosstalk structure
140 second substrate
150 retaining wall
160 optically clear adhesive
170 third substrate
171 first planarization layer
172 second planarization layer
173 third planarization layer
174 fourth planarization layer
181 first inorganic layer
182 second inorganic layer
183 third inorganic layer
184 fourth inorganic layer
185 fifth inorganic layer
186 sixth inorganic layer.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

An object of the present disclosure is to provide a display panel, a method for manufacturing the display panel, and a display device, so as to solve the problem in the related art where an OLED is easily eroded by moisture and oxygen and thereby an imperfect display effect occurs for a quantum dot display device when a quantum dot module is pressed against a light-emitting module and an encapsulation film layer of the light-emitting module is damaged.

Figure 1:
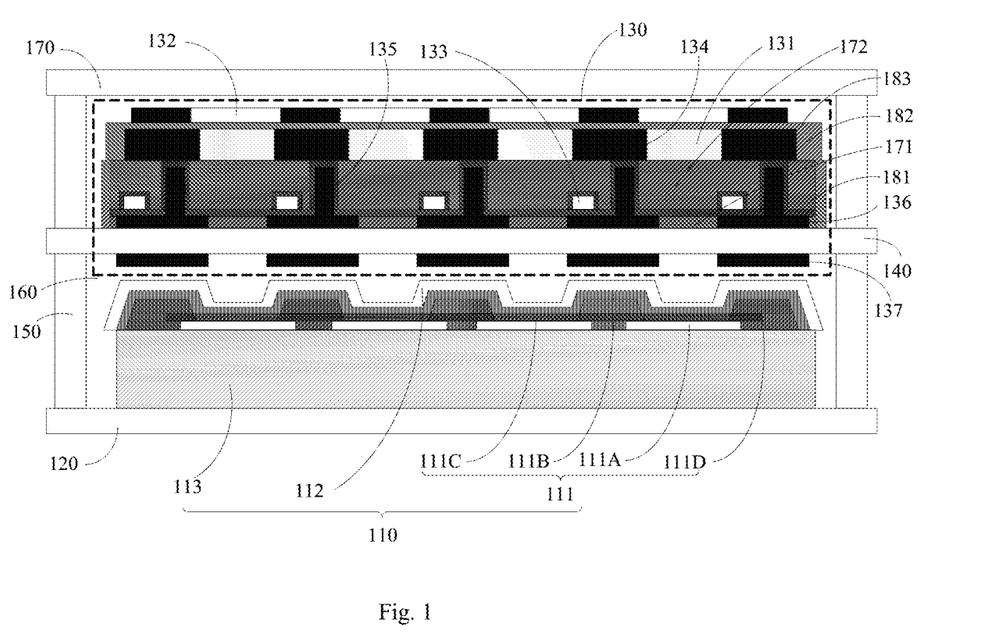
FIG. 1 is a schematic view showing a display panel according to one embodiment of the present disclosure.

The present disclosure provides in some embodiments a display panel which, as shown in FIG. 1, includes: a light-emitting module 110 including an electroluminescent element 111 and a thin film encapsulation layer 112 for encapsulating the electroluminescent element 111 arranged on a first substrate 120 sequentially; a quantum dot module 130 including a plurality of quantum dot light-emitting units 131 spaced apart from each other; and a second substrate 140 located between the light-emitting module 110 and the quantum dot module 130, and configured to support the quantum dot module 130 at a side of the light-emitting module 110 away from the first substrate 120. An orthogonal projection of the thin film encapsulation layer 112 onto the first substrate 120 is located within an orthogonal projection of the second substrate 140 onto the first substrate 120.

According to the embodiments of the present disclosure, the second substrate is arranged between the light-emitting module and the quantum dot module, and a weight of the quantum dot module is applied onto the thin-film encapsulation layer of the light-emitting module through the second substrate, so it is able to reduce a pressure applied onto the thin film encapsulation layer, prevent the thin film encapsulation layer from being damaged, and prevent moisture and oxygen from entering the electroluminescent element, thereby to ensure luminous efficiency of the electroluminescent element and a display effect of the display device.

The light-emitting module 110 is formed on the first substrate 120 and includes the electroluminescent element 111 and the thin film encapsulation layer 112. The electroluminescent element 111 is used to emit basic light, such as blue light, that excites the quantum dot light-emitting unit 131 to emit light. The thin-film encapsulation layer 112 is used to prevent external moisture and oxygen from entering the light-emitting module 110 to erode the electroluminescent element, thereby to prevent the luminous efficiency of the electroluminescent element from being deteriorated. The thin film encapsulation layer includes an inorganic film layer and an organic film layer.

The electroluminescent element 111 includes an anode 111A, a cathode 111B and a light-emitting layer 111C. The anode 111A is located between the first substrate 120 and the light-emitting layer 111C, the cathode layer 111B is located between the light-emitting layer 111C and the thin film encapsulation layer 112. The light-emitting layer 111C is coupled to the anode 111A and the cathode 111B. In a possible embodiment of the present disclosure, an orthogonal projection of the light-emitting layer 111C onto the first substrate 120 is located within an orthogonal projection of the anode 111A onto the first substrate 120.

In the embodiments of the present disclosure, the electroluminescent element 111 is an OLED. Under the effect of an electric field formed by the anode 111A and the cathode 111B, holes generated by the anode 111A and electrons generated by the cathode 111B move toward a hole transport layer and an electron transport layer respectively, and migrate to the light-emitting layer 111C, so as to generate energy to excite visible light.

A pixel definition layer 111D is further arranged between the cathode 111B and the anode 111A, and configured to insulate the light-emitting layers 111C of two adjacent electroluminescent elements 111 from each other.

The light-emitting module 110 further includes other structures, such as a thin film transistor array layer 113 used to control an electric signal for the electroluminescent element 111, a buffer layer, an insulation layer, etc., which will not be particularly defined herein.

The quantum dot module 130 is formed on the second substrate 140 and includes the plurality of quantum dot light-emitting units 131 spaced apart from each other. The quantum dot light-emitting units 131 include quantum dot light-emitting units in different colors arranged in a preset order. The quantum dot light-emitting units include a red quantum dot light-emitting unit, a green quantum dot light-emitting unit and a blue quantum dot light-emitting unit. Of course, the quantum dot light-emitting units also include other color quantum dot light-emitting units, such as a white quantum dot light-emitting unit. When the basic light is blue light, the blue quantum dot light-emitting unit 131 is a blue transparent layer.

The quantum dot module 130 further includes other structures, such as a color filter layer 132 at a light-exiting side of each quantum dot light-emitting unit 131. The color filter layer 132 is arranged in such a manner as to correspond to a color of the quantum dot light-emitting unit 131, and configured to allow target light emitted through exciting the color filter layer 132 to pass therethrough and block the basic light. When the basic light is blue light, a blue color filter layer is used to allow the blue light to pass therethrough and block light in the other colors.

The weight of the quantum dot module 130 supported by the second substrate 140 is applied onto the thin-film encapsulation layer 112. Due to a large force bearing area, the pressure is small, so it is able to prevent the thin film encapsulation layer 112 from being damaged, thereby to prevent moisture and oxygen from entering the light-emitting module 110 through the thin-film encapsulation layer 112.

In addition, the quantum dot module 130 is entirely pressed against the second substrate 140, so it is able to further prevent the deformation of the quantum dot light-emitting units 131 when the light-emitting module 110 and the quantum dot module 130 are arranged opposite to each other, and improve the uniformity of light emission of the quantum dot light-emitting units 131, thereby to improve the display quality of the display device.

In a possible embodiment of the present disclosure, the display panel further includes a retaining wall 150 located between the first substrate 120 and the second substrate 140, and configured to enclose the light-emitting module 110. The display panel further includes an optically clear adhesive 160 configured to fill a gap among the retaining wall 150, the light-emitting module 110 and the second substrate 140.

The second substrate 140 supported by the retaining wall 150 and the first substrate 120 are arranged opposite to each other for the encapsulation, and the retaining wall 150 is used to carry a weight of the second substrate 140. When the gap among the retaining wall 150, the light-emitting module 110 and the second substrate 140 is filled with the optically clear adhesive 160, it is able to fix positions of the retaining wall 150, the light-emitting module 110 and the second substrate 140. In addition, the optically clear adhesive 160 also carries a part of the weight of the second substrate 140, so as to protect the thin film encapsulation layer 112 of the light-emitting module 110.

In a possible embodiment of the present disclosure, as shown in FIG. 1, the quantum dot module 130 further includes optical sensors 133 electrically coupled to sensing lines and each configured to detect an intensity of light emitted by a corresponding quantum dot light-emitting unit 131. The intensity of the light is used as a basis for compensating for a luminous intensity of the electroluminescent element corresponding to the optical sensor.

Figure 2:
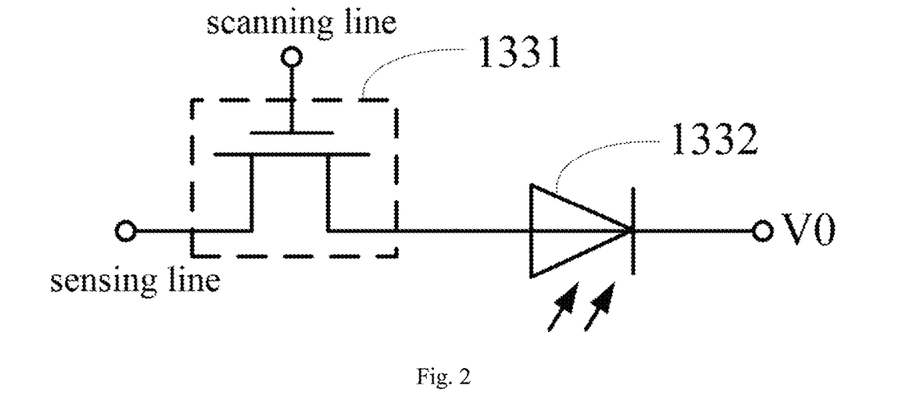
FIG. 2 is a schematic view showing an optical sensor in the display panel according to one embodiment of the present disclosure.

In the embodiments of the present disclosure, each quantum dot light-emitting unit 131 corresponds to one optical sensor 133 for measuring the intensity of light emitted by the quantum dot light-emitting unit 131. To be specific, as shown in FIG. 2, the optical sensor 133 includes a switching unit 1331 and a photodiode 1332. A switching unit 1331 is used to control an output end of the photodiode 1332 to be electrically coupled to a sensing line Sense. The sensing line Sense is used to transmit an electric signal outputted by the photodiode 1332 to an integrated circuit (such as a field programmable logic gate array). The integrated circuit is configured to determine the luminous intensity of each quantum dot light-emitting unit 131 through analyzing the electric signal outputted by the photodiode 1332, and determine a compensation value for the electroluminescent element 111 corresponding to each quantum dot light-emitting unit 131, so as to compensate for the light emitted by the electroluminescent element 111.

As shown in FIG. 2, the display panel includes a constant-voltage line V0, a scanning line Scan and the sensing line Sense. A first end of the photodiode 1332 is coupled to the constant-voltage line V0, and a second end of the photodiode 1332 is coupled to an input end of the switching unit 1331. An output end of the switching unit 1331 is coupled to the sensing line Sense, and a control end of the switching unit 1331 is coupled to the scanning line Scan. Under the control of a scanning signal from the scanning line Scan, the switching unit 1321 controls the second end of the photodiode 1332 to be electrically coupled to the sensing line Sense, so as to write the electric signal from the photodiode 1332 into the sensing line Sense.

The switching unit 1331 is an N-type thin film transistor, the input end of the switching unit 1331 is a source electrode of the N-type thin film transistor, the output end of the N-type thin film transistor 1331 is a drain electrode of the N-type thin film transistor, and the control electrode of the N-type thin film transistor 1331 is a gate electrode of the N-type thin film transistor. Of course, the switching unit 1331 is also a P-type thin film transistor, a triode, etc., which will not be particularly defined herein.

Figure 3:
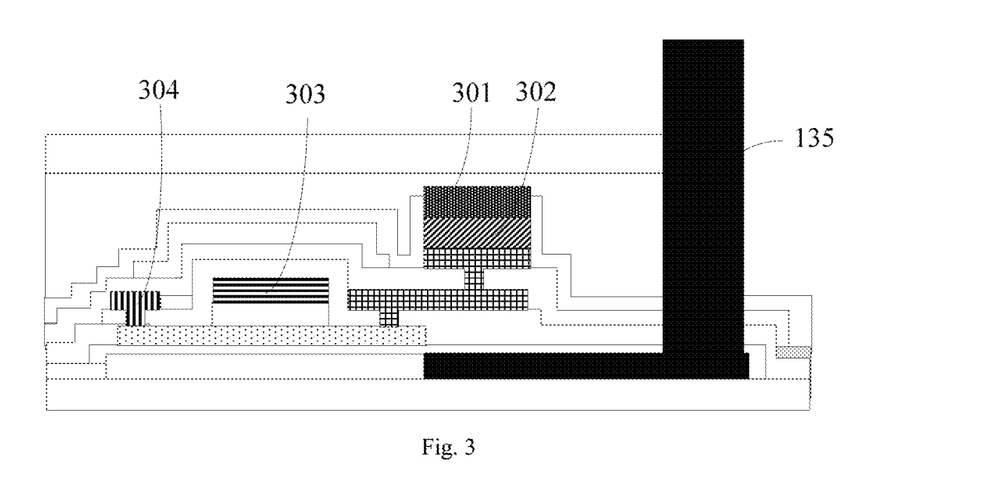
FIG. 3 is a schematic view showing a layer structure of the optical sensor according to one embodiment of the present disclosure.

A film structure of the optical sensor 133 in the display panel is shown in FIG. 3. In FIG. 3, 301 represents the constant-voltage line V0, 302 represents the photodiode 1332, 303 represents the control end of the switching unit 1331 connected to the scanning line Scan, and 304 represents the sensing line Sense.

Further, an orthogonal projection of each optical sensor 133 onto the first substrate 120 partially overlaps an orthogonal projection of the corresponding quantum dot light-emitting unit 131 onto the first substrate 120.

Figure 4:
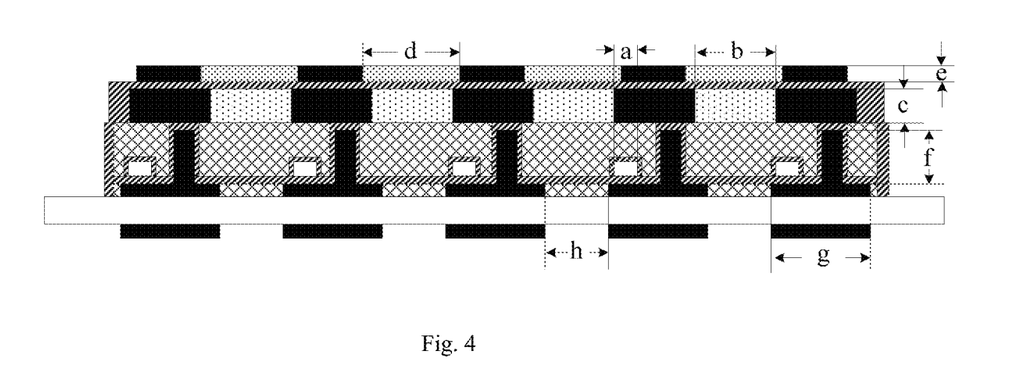
FIG. 4 is a schematic view showing a size of each structure in a quantum dot module in FIG. 1.

As shown in FIG. 4, a width a of the optical sensor 133 in a direction parallel to the second substrate 140 ranges from 2 μm to 25 μm. In a possible embodiment of the present disclosure, a width of the optical sensor used to measure the luminous intensity of the green quantum dot light-emitting unit is 5.2 μm, and a width of the optical sensor used to measure the luminous intensity of each of the red quantum dot light-emitting unit and the blue quantum dot light-emitting unit is 9.5 μm.

A width b of the quantum dot light-emitting unit 131 in the direction parallel to the second substrate 140 ranges from 10 μm to 200 μm. In a possible embodiment of the present disclosure, a width of the green quantum dot light-emitting unit 131 in the direction parallel to the second substrate 140 is 52 μm, and a width of each of the red quantum dot light-emitting unit and the blue quantum dot light-emitting unit in the direction parallel to the second substrate 140 is 95 μm.

A height c of the quantum dot light-emitting unit 131 in a direction perpendicular to the second substrate 140 ranges from 1 μm to 20 μm, e.g., 12 μm.

In the embodiments of the present disclosure, an overlapping width of an overlapping region between the orthogonal projection of the optical sensor 133 onto the first substrate 120 and the orthogonal projection of the quantum dot light-emitting unit 131 onto the first substrate 120 ranges from 2 μm to 18 μm. In a possible embodiment of the present disclosure, an overlapping width of an overlapping region between the orthogonal projection of the optical sensor 133 onto the first substrate 120 and an orthogonal projection of the green quantum dot light-emitting unit 131 onto the first substrate 120 is 2.6 μm, and an overlapping width of an overlapping region between the orthogonal projection of the optical sensor 133 onto the first substrate 120 and an orthogonal projection of the red quantum dot light-emitting unit or the blue quantum dot light-emitting unit onto the first substrate 120 is 5.1 μm.

A width of an overlapping region between an orthogonal projection of the red quantum dot light-emitting unit onto the first substrate and the orthogonal projection of the corresponding optical sensor onto the first substrate along a row direction of the electroluminescent element is larger than a width of an overlapping region between an orthogonal projection of the green quantum dot light-emitting unit onto the first substrate and the orthogonal projection of the corresponding optical sensor onto the first substrate along the row direction of the electroluminescent element; and/or, a width of an overlapping region between an orthogonal projection of the blue quantum dot light-emitting unit onto the first substrate and the orthogonal projection of the corresponding optical sensor onto the first substrate along the row direction of the electroluminescent element is larger than the width of the overlapping region between the orthogonal projection of the green quantum dot light-emitting unit onto the first substrate and the orthogonal projection of the corresponding optical sensor onto the first substrate along the row direction of the electroluminescent element.

The width along the row direction of the electroluminescent element refers to a horizontal length in FIG. 4.

A ratio of the overlapping width to the width of the quantum dot light-emitting unit approximately ranges from 0.040 to 0.065, and a ratio of the width of the optical sensor to the width of the quantum dot light-emitting unit approximately ranges from 0.08 to 0.120.

It should be appreciated that, luminous efficiency of a green sub-pixel is larger than luminous efficiency of a blue sub-pixel and luminous efficiency of a red sub-pixel, so a size of the green quantum dot light-emitting unit is smaller than a size of the blue sub-pixel and a size of the red sub-pixel. Based on a preset ratio, sizes of the optical sensor and color filter layer corresponding to the green quantum dot light-emitting unit are also smaller than sizes of the optical sensor and color filter layer corresponding to the quantum dot light-emitting unit in the other colors.

In this way, it is able for the optical sensor 133 to directly sense the light from the quantum dot light-emitting unit 131. In addition, the optical sensor 133 overlaps the quantum dot light-emitting unit 131 to a small extent, so it is able to reduce a region where the light is shielded by the optical sensor 133.

In addition, in the case that the quantum dot module 130 further includes the color filter layer 132, a width d of the color filter layer 132 in the direction parallel to the second substrate 140 ranges from 10 μm to 200 μm. In a possible embodiment of the present disclosure, the width of the color filter layer corresponding to the green quantum dot light-emitting unit in the direction parallel to the second substrate 140 is 67 μm, and the width of the color filter layer corresponding to the red quantum dot light-emitting unit or the blue quantum dot light-emitting unit in the direction parallel to the second substrate 140 is 110 μm.

A height e of the color filter layer 132 in the direction perpendicular to the second substrate 140 ranges from 1 μm to 10 μm, e.g., 1.6 μm.

Further, a black matrix 134 is provided between adjacent quantum dot light-emitting units 131.

Through the black matrix 134, it is able to prevent the basic light from passing through a gap between the adjacent quantum dot light-emitting units 131. The color filter layer 132 only corresponds to a region where the quantum dot light-emitting unit 131 is located, and the basic light passing through the gap between adjacent quantum dot light-emitting units 131 is not blocked by the color filter layer 132. At this time, a ratio of the basic light in display light is reduced, and thereby the display effect of the display device is adversely affected.

A height of the black matrix 134 in the direction perpendicular to the second substrate 140 is the same as the height c of the quantum dot light-emitting unit 131 in the direction perpendicular to the second substrate 140, and ranges from 1 μm to 20 μm, e.g., 12 μm.

In a possible embodiment of the present disclosure, as shown in FIG. 1, the quantum dot module 130 further includes a plurality of supporting structures 135, each supporting structure 135 is located between the corresponding black matrix 134 and the second substrate 140 to define an accommodation space between the corresponding black matrix 134 and the second substrate 140, and a corresponding optical sensor 133 is located in the accommodation space.

The quantum dot module 130 further includes the supporting structure 135 located between the corresponding black matrix 134 and the second substrate 140 to define the accommodation space for accommodating the corresponding optical sensor 133 between the corresponding black matrix 134 and the second substrate 140.

An orthogonal projection of each supporting structure 135 onto the second substrate 140 is located within an orthogonal projection of the corresponding black matrix 134 onto the second substrate 140. As shown in FIG. 4, a height f of the supporting structure 135 in the direction perpendicular to the second substrate 140 ranges from 1 μm to 10 μm, e.g., 4.5 μm.

In the embodiments of the present disclosure, apart from defining a space for accommodating the optical sensor 133 between the second substrate 140 and the black matrix 134 (the quantum dot light-emitting unit 131), the supporting structure 135 is also made of a black material so as to isolate light path spaces corresponding to the quantum dot light-emitting units 131 from each other, prevent the light emitted by the quantum dot light-emitting units 131 from interfering with each other, and enable the optical sensor 133 to only detect the light emitted by the corresponding quantum dot light-emitting unit 131 without being affected by the light emitted by the other quantum dot light-emitting units 131, thereby to improve the accuracy of luminous compensation as well as the display effect of the display device.

As shown in FIG. 1, the quantum dot module 130 further includes a plurality of light-shielding structures 136, each light-shielding structure 136 is located between the corresponding retaining wall 135 and the second substrate 140, each optical sensor 133 is arranged at a side of the corresponding light-shielding structure 136 away from the light-emitting module 110, and an orthogonal projection of each optical sensor 133 onto the first substrate 120 is located within an orthogonal projection of the corresponding light-shielding structure 136 onto the first substrate 120.

In the embodiments of the present disclosure, the light-shielding structure 136 is formed at a side of the second substrate 140 close to the optical sensor 133, and the orthogonal projection of the optical sensor 133 onto the first substrate 120 is located within the orthogonal projection of the corresponding light-shielding structure 136 onto the first substrate 120, that is, the light-shielding structure 136 is configured to block the light from a side of the second substrate 140 away from the optical sensor 133, so as to prevent the optical sensor 133 from being adversely affected by the light emitted by the light-emitting module 110 during the measurement, thereby to improve the accuracy of luminous compensation as well as the display effect of the display device.

A width g of the light-shielding structure 136 in the direction parallel to the second substrate 140 ranges from 10 μm to 100 μm, e.g., 30 μm. A spacing h between adjacent light-shielding structures 136 in the direction parallel to the second substrate 140 ranges from 10 μm to 200 μm. A spacing corresponding to the green quantum dot light-emitting unit is 60 μm, and a spacing corresponding to each of the red quantum dot light-emitting unit and the blue quantum dot light-emitting unit is 90 μm.

Figure 5:
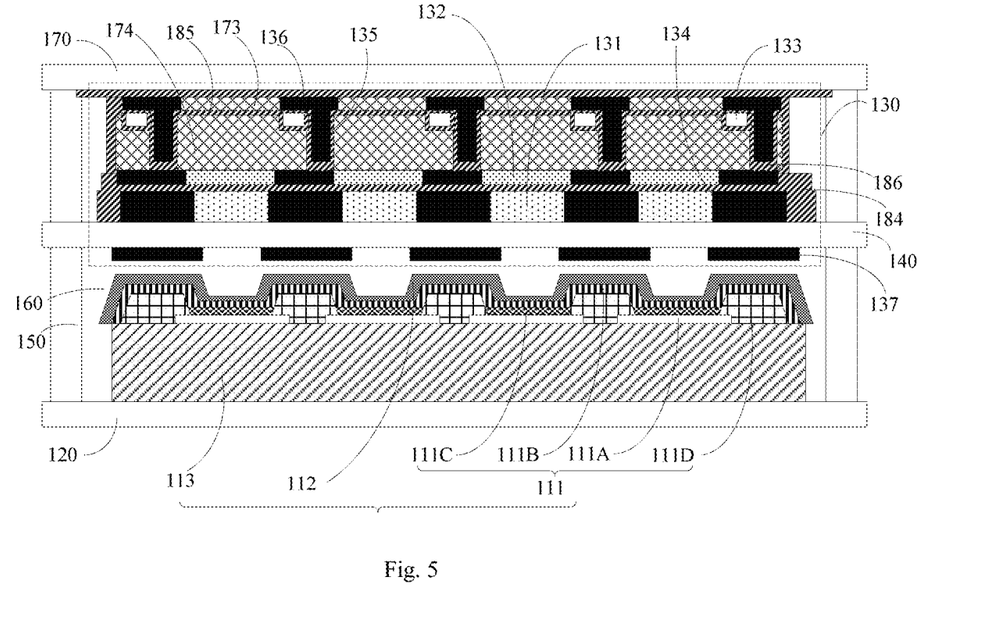
FIG. 5 is another schematic view showing the display panel according to one embodiment of the present disclosure.

In another possible embodiment of the present disclosure, as shown in FIG. 5, the quantum dot module 130 further includes a plurality of supporting structures 135, each supporting structure 135 is located at a side of the corresponding black matrix 134 away from the second substrate 140 to define an accommodation space on the side of the corresponding black matrix 134 away from the second substrate 140, and a corresponding optical sensor 133 is located in the accommodation space.

The quantum dot module 130 further includes the supporting structure 135 located between the black matrix 134 and a third substrate 170 and configured to define the accommodation space for accommodating the optical sensor 133 between the black matrix 134 and the third substrate 170.

In the embodiments of the present disclosure, an orthogonal projection of the supporting structure 135 onto the second substrate 140 is within an orthogonal projection of the corresponding black matrix 134 onto the second substrate 140. A height f of the supporting structure 135 in the direction perpendicular to the second substrate 140 in FIG. 4 ranges from 1 μm to 10 μm, e.g., 4.5 μm.

In the embodiments of the present disclosure, apart from defining a space for accommodating the optical sensor 133 between the third substrate 170 and the black matrix 134 (the quantum dot light-emitting unit 131), the supporting structure 135 is also made of a black material, so as to isolate light path spaces corresponding to the quantum dot light-emitting units 131 from each other, prevent the light emitted by the quantum dot light-emitting units 131 from interfering with each other, and enable the optical sensor 133 to only detect the light emitted by the corresponding quantum dot light-emitting unit 131 without being adversely affected by the light emitted by the surrounding quantum dot light-emitting units 131, thereby to improve the accuracy of luminous compensation as well as the display effect of the display device.

As shown in FIG. 5, the quantum dot module 130 further includes a plurality of light-shielding structures 136, each light-shielding structure 136 abuts against a surface of the corresponding supporting structure 135 away from the second substrate 140, each optical sensor 133 is arranged at a side of the corresponding light-shielding structure 136 close to the second substrate 140, and an orthogonal projection of the optical sensor 133 onto the first substrate 110 is located within an orthogonal projection of the light-shielding structure 136 onto the first substrate 110.

In the embodiments of the present disclosure, the light-shielding structure 136 is formed at a side of the third substrate 160 close to the optical sensor 133, the optical sensor 133 is formed at a side of the light-shielding structure 136 close to the second substrate 140, and the third substrate 160 and the second substrate 140 are arranged opposite to each other for encapsulation.

In the embodiments of the present disclosure, the orthogonal projection of the optical sensor 133 onto the first substrate 120 is located within the orthogonal projection of the light-shielding structure 136 onto the first substrate 120, that is, the light-shielding structure 136 is configured to block the light from a side of the third substrate 160 away from the optical sensor 133, so as to prevent the optical sensor 133 from being adversely affected by the light from the side of the third substrate 160 away from the optical sensor 133 during measurement, thereby to improve the accuracy of luminous compensation as well as the display effect of the display device.

In addition, in the other embodiments of the present disclosure, as shown in FIG. 1 and FIG. 5, an anti-crosstalk structure 137 is further provided at a side of the second substrate 140 close to the first substrate 120, and an orthogonal projection of a gap between two adjacent quantum dot light-emitting units 131 onto the first substrate 120 is located within an orthogonal projection of the anti-crosstalk structure 137 onto the first substrate 120, so as to prevent light emitted by the quantum dot light-emitting unit in a first color from entering the quantum dot light-emitting unit in a second color.

In the embodiments of the present disclosure, the anti-crosstalk structure 137 is configured to prevent the light emitted by the quantum dot light-emitting unit 131 from diffracting from the second substrate 140 into spaces corresponding to other quantum dot light-emitting units 131. In addition, the anti-crosstalk structure 137 is further configured to absorb the light emitted by the light-emitting module 110 that is beyond the region where the quantum dot light-emitting unit 131 is located, so as to enable each quantum dot light-emitting unit 131 to receive the uniform basic light.

It should be appreciated that, inorganic material layers deposited through chemical vapor deposition (CVD) are further provided between various structures in the quantum dot module 130, and each inorganic material layer is made of silicon nitride, silicon oxynitride, silicon oxide, etc. Through the inorganic material layers, it is able to prevent moisture and oxygen from entering the light-emitting module 110 and ensure the luminous efficiency of the quantum dot module 130. For example, in FIG. 1, a first inorganic layer 181 is deposited between the optical sensor 133 and the light-shielding structure 136. For another example, in FIG. 5, a fourth inorganic layer 184 is deposited between the quantum dot light-emitting unit 131 and the color filter layer 132.

The present disclosure further provides in some embodiments a method for manufacturing a display panel, which includes: providing a first substrate, and sequentially forming an electroluminescent element and a thin film encapsulation layer on the first substrate; providing a second substrate, and forming a quantum dot module on the second substrate, the quantum dot module including a plurality of quantum dot light-emitting units spaced apart from each other; and encapsulating the second substrate onto the thin film encapsulation layer, an orthogonal projection of the thin film encapsulation layer onto the first substrate being located within an orthogonal projection of the second substrate onto the first substrate According to the embodiments of the present disclosure, the second substrate is arranged between the light-emitting module and the quantum dot module, and a weight of the quantum dot module is applied onto the thin-film encapsulation layer of the light-emitting module through the second substrate, so it is able to reduce a pressure applied onto the thin film encapsulation layer, prevent the thin film encapsulation layer from being damaged, and prevent moisture and oxygen from entering the electroluminescent element, thereby to ensure luminous efficiency of the electroluminescent element and a display effect of the display device.

As shown in FIG. 1, the light-emitting module 110 is formed on the first substrate 120 and includes the electroluminescent element 111 and the thin film encapsulation layer 112. The electroluminescent element 111 is used to emit basic light, such as blue light, that excites the quantum dot light-emitting unit 131 to emit light. The thin-film encapsulation layer 112 is used to prevent external moisture and oxygen from entering the light-emitting module 110 to erode the electroluminescent element, thereby to prevent the luminous efficiency of the electroluminescent element from being deteriorated. The thin film encapsulation layer includes an inorganic film layer and an organic film layer.

The electroluminescent element 111 includes an anode 111A, a cathode 111B and a light-emitting layer 111C. The anode 111A is located between the first substrate 120 and the light-emitting layer 111C, the cathode 111B is located between the light-emitting layer 111C and the thin film encapsulation layer 112. The light-emitting layer 111C is coupled to the anode 111A and the cathode 111B. In a possible embodiment of the present disclosure, an orthogonal projection of the light-emitting layer 111C onto the first substrate 120 is located within an orthogonal projection of the anode 111A onto the first substrate 120.

In the embodiments of the present disclosure, the electroluminescent element 111 is an OLED. Under the effect of an electric field formed by the anode 111A and the cathode 111B, holes generated by the anode 111A and electrons generated by the cathode 111B move toward a hole transport layer and an electron transport layer respectively, and migrate to the light-emitting layer 111C, so as to generate energy to excite visible light.

A pixel definition layer 111D is further included between the cathode 111B and the anode 111A, and configured to insulate light-emitting layers 111C of two adjacent electroluminescent elements 111 from each other.

The light-emitting module 110 further includes other structures, such as a thin film transistor array layer 113 used to control an electric signal for the electroluminescent element 111, a buffer layer, an insulation layer, etc., which will not be particularly defined herein.

The quantum dot module 130 is formed on the second substrate 140 and includes the plurality of quantum dot light-emitting units 131 spaced apart from each other. The quantum dot light-emitting units 131 include quantum dot light-emitting units in different colors arranged in a preset order. The quantum dot light-emitting units include a red quantum dot light-emitting unit, a green quantum dot light-emitting unit and a blue quantum dot light-emitting unit. Of course, the quantum dot light-emitting units also include other color quantum dot light-emitting units, such as a white quantum dot light-emitting unit. When the basic light is blue light, the blue quantum dot light-emitting unit 131 is a blue transparent layer.

The quantum dot module 130 further includes other structures, such as a color filter layer 132 at a light-exiting side of each quantum dot light-emitting unit 131. The color filter layer 132 is arranged in such a manner as to correspond to a color of the quantum dot light-emitting unit 131, and configured to allow target light emitted through exciting the color filter layer 132 to pass therethrough and block the basic light. When the basic light is blue light, a blue color filter layer is used to allow the blue light to pass therethrough and block light in the other colors.

The weight of the quantum dot module 130 supported by the second substrate 140 is applied onto the thin-film encapsulation layer 112. Due to a large force bearing area, the pressure is small, so it is able to prevent the thin film encapsulation layer 112 from being damaged, thereby to prevent moisture and oxygen from entering the light-emitting module 110 through the thin-film encapsulation layer 112.

In addition, the quantum dot module 130 is entirely pressed against the second substrate 140, so it is able to further prevent the deformation of the quantum dot light-emitting units 131 when the light-emitting module 110 and the quantum dot module 130 are arranged opposite to each other, and improve the uniformity of light emission of the quantum dot light-emitting units 131, thereby to improve the display quality of the display device.

Further, the forming the quantum dot module on the second substrate includes: forming light-shielding structures on the second substrate; forming an optical sensor and a supporting structure at a side of each light-shielding structure away from the second substrate, an orthogonal projection of the optical sensor onto the first substrate and an orthogonal projection of the supporting structure onto the first substrate not overlapping each other and being located within an orthogonal projection of the light-shielding structure onto the first substrate; forming a black matrix at a side of the supporting structure away from the second substrate; and forming a quantum dot light-emitting unit between two adjacent black matrices, an orthogonal projection of each quantum dot light-emitting unit onto the first substrate partially overlapping the orthogonal projection of the corresponding optical sensor onto the first substrate.

Figure 6A:
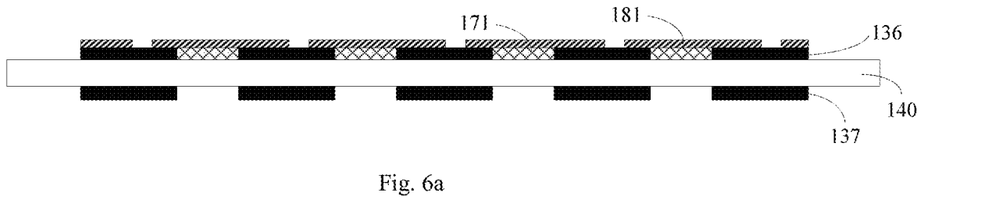
FIGS. 6a to 6f are schematic views showing the manufacture of the quantum dot module in the display panel according to one embodiment of the present disclosure.
Figure 6B:
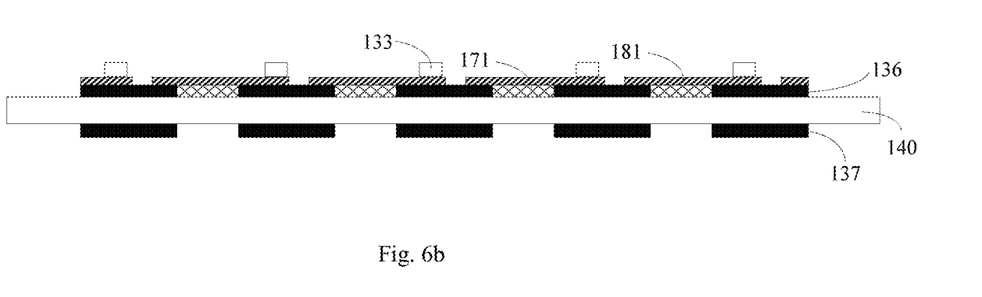
Figure 6C:
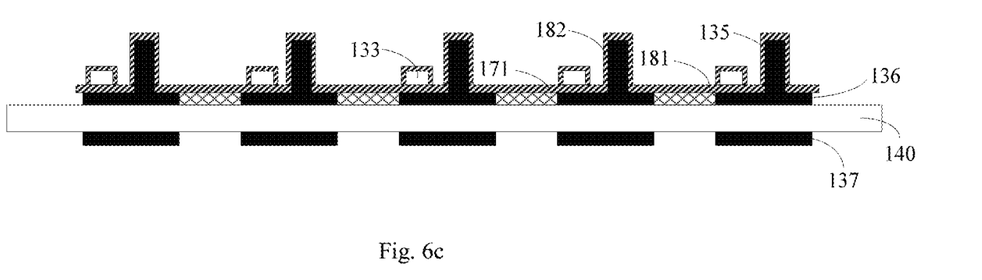

In the embodiments of the present disclosure, as shown in FIG. 6a, the light-shielding structures 136 are formed on the second substrate 140. Before the formation of the light-shielding structures 136, the anti-crosstalk structures 137 are further formed on a surface of the second substrate 140 opposite to the first substrate 120. After the formation of the light-shielding structures 136, a first planarization layer 171 is formed. A surface of the first planarization layer 171 away from the second substrate 140 is flush with a surface of each light-shielding structure 136 away from the second substrate 140. After the formation of the first planarization layer 171, a first inorganic layer 181 is formed on the light-shielding structures 136 and the first planarization layer 171. Via-holes are provided in such a manner as to penetrate through the first inorganic layer 181 at target regions, and an orthogonal projection of each via-hole onto the second substrate 140 is located within an orthogonal projection of the corresponding light-shielding structure 136 onto the second substrate 140.

Next, the optical sensors 133 are formed at a side of the first inorganic layer 181 away from the second substrate 140, and each optical sensor 133 is arranged close to the corresponding target region, as shown in FIG. 6. The supporting structures 135 are formed at the target regions, and each supporting structure 135 covers the corresponding via-hole. A height of each supporting structure 135 in a direction perpendicular to the second substrate 140 is larger than a height of the optical sensor 133 in the direction perpendicular to the second substrate 140. A second inorganic layer 182 covering the optical sensors 133 and the supporting structures 135 is formed, as shown in FIG. 6c.

Figure 6D:
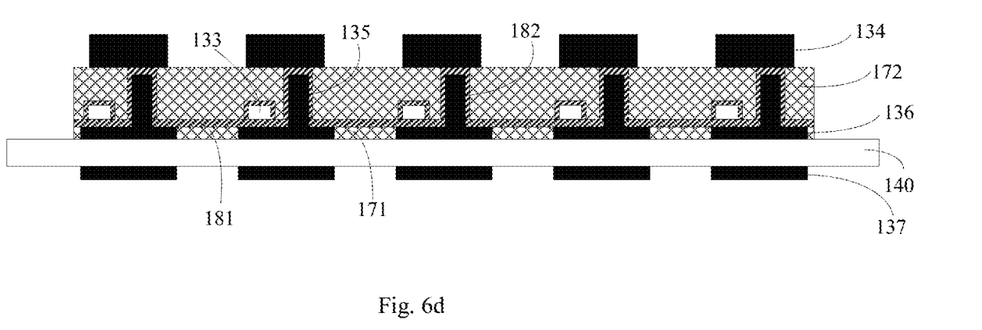

Next, a second planarization layer 172 covering the optical sensors 133, the supporting structures 135, the first inorganic layer 181 and the second inorganic layer 182 is formed on the second substrate 140, black matrices 134 are formed on the second planarization layer 172, and the orthogonal projection of each supporting structure 135 onto the second substrate 140 is located within an orthogonal projection of a corresponding black matrix 134 onto the second substrate 140, as shown in FIG. 6d.

Figure 6E:
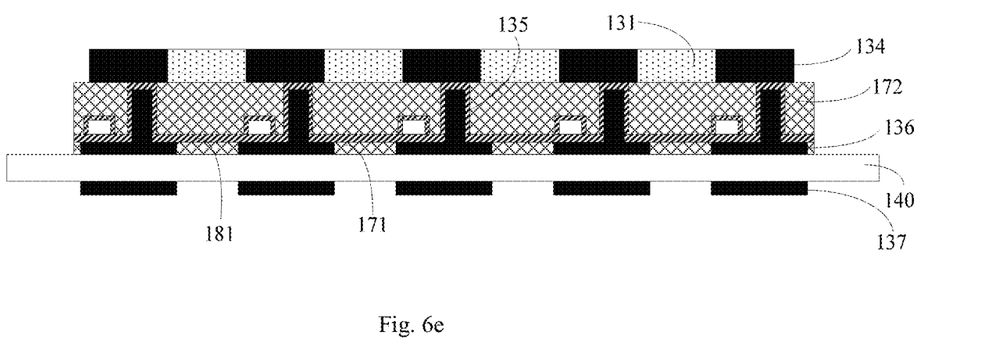

Next, quantum dot light-emitting units 131 in different colors are formed in gaps between the black matrices 134, as shown in FIG. 6e, and an orthogonal projection of each quantum dot light-emitting unit 131 onto the first substrate 120 partially overlaps the orthogonal projection of the corresponding optical sensor 133 onto the first substrate 120.

Figure 6F:
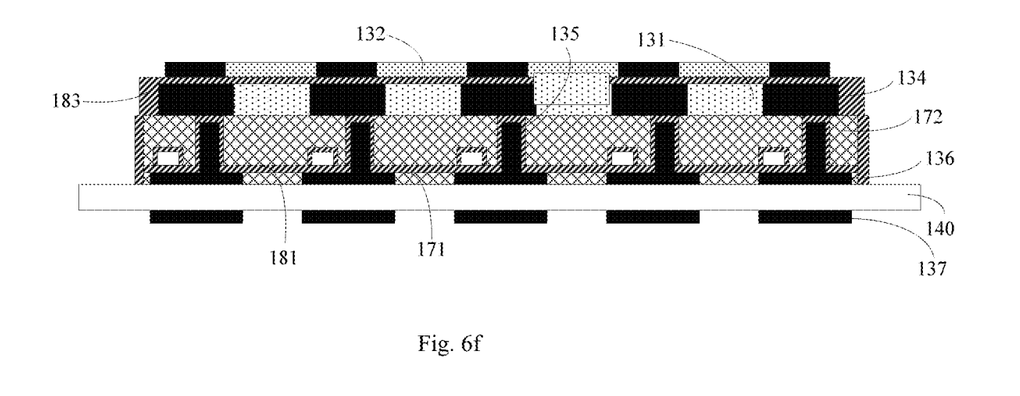

In addition, after the formation of the quantum dot light-emitting units 131 of the quantum dot module 130, a third inorganic layer 183 covering the black matrices 134 and the quantum dot light-emitting units 131 is further formed, and the color filter layers 132 spaced apart from each other and black matrices each between adjacent color filter layers 132 are formed on the third inorganic layer 183.

Further, the forming the quantum dot module on the second substrate includes: forming the black matrices and the quantum dot light-emitting units each located between two adjacent black matrices on the second substrate; providing a third substrate, and forming the light-shielding structures on the third substrate; forming the optical sensor and the supporting structure at a side of each light-shielding structure away from the third substrate, an orthogonal projection of the optical sensor onto the third substrate and an orthogonal projection of the supporting structure onto the third substrate not overlapping each other and being located in an orthogonal projection of the light-shielding structure onto the third substrate; and encapsulating the third substrate at a side of the quantum dot light-emitting units away from the second substrate. The optical sensor, the supporting structure and the light-shielding structure are located between the third substrate and the second substrate, and an orthogonal projection of each quantum dot light-emitting unit onto the second substrate partially overlaps the orthogonal projection of the corresponding optical sensor onto the second substrate.

Figure 7A:
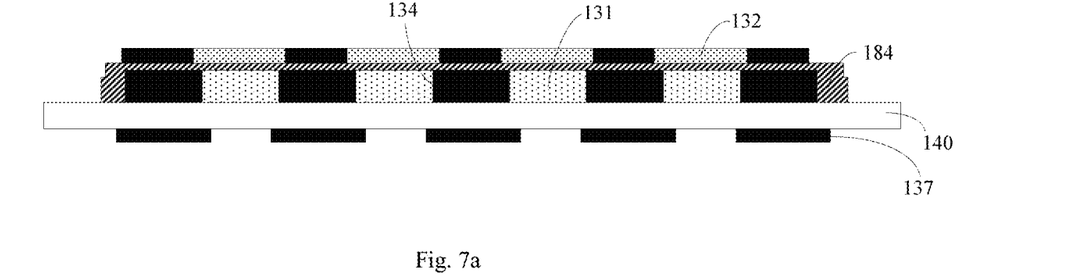
FIG. 7a and FIG. 7b are schematic views showing two parts for encapsulation in the quantum dot module of the display panel according to one embodiment of the present disclosure.

In the embodiments of the present disclosure, as shown in FIG. 7a, the black matrices 134 are formed on the second substrate 140, and then the quantum dot light-emitting units 131 in different colors are formed in the gaps between the black matrices 134. After the formation of the quantum dot light-emitting units 131, a fourth inorganic layer 184 covering the black matrices 134 and the quantum dot light-emitting units 131 is formed, and the color filter layers 132 spaced apart from each other and black matrices each between adjacent color filter layers 132 are formed on the fourth inorganic layer 184.

Figure 7B:
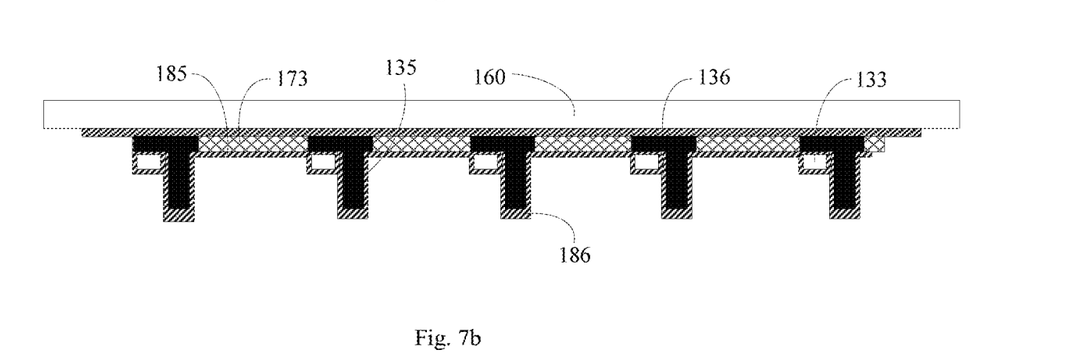

In the embodiments of the present disclosure, as shown in FIG. 7b, the light-shielding structures 136 are formed on the third substrate 160. After the formation of the light-shielding structures 136, a third planarization layer 173 is formed. A surface of the third planarization layer 173 away from the third substrate 160 is flush with a surface of each light-shielding structure 136 away from the third substrate 160. After the formation of the third planarization layer 173, a fifth inorganic layer 185 is formed on the light-shielding structures 136 and the third planarization layer 173. Second via-holes are provided in such a manner as to penetrate through the fifth inorganic layer 185 at second target regions, and an orthogonal projection of each second via-hole onto the third substrate 160 is located within the orthogonal projection of the corresponding light-shielding structure 136 onto the third substrate 160.

Next, the optical sensors 133 are formed at a side of the fifth inorganic layer 185 away from the third substrate 160, and each optical sensor 133 is arranged close to the corresponding second target region, as shown in FIG. 7b. The supporting structures 135 are formed at the second target regions, and each supporting structure 135 covers the corresponding second via-hole. A height of each supporting structure 135 in the direction perpendicular to the third substrate 160 is larger than a height of the optical sensor 133 in the direction perpendicular to the third substrate 160. A sixth inorganic layer 186 covering the optical sensors 133 and the supporting structures 135 is formed, as shown in FIG. 7b.

The present disclosure further provides in some embodiments a display device, including the above-mentioned display panel.

The display device is a monitor, a mobile phone, a tablet personal computer, a television, a wearable electronic device, a navigation display device, etc.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
   a light-emitting module comprising an electroluminescent element and a thin film encapsulation layer for encapsulating the electroluminescent element arranged on a first substrate sequentially;
   a quantum dot module comprising a plurality of quantum dot light-emitting units spaced apart from each other; and
   a second substrate located between the light-emitting module and the quantum dot module, and configured to support the quantum dot module at a side of the light-emitting module away from the first substrate,
   wherein an orthogonal projection of the thin film encapsulation layer onto the first substrate is located within an orthogonal projection of the second substrate onto the first substrate;
   wherein a black matrix is provided between adjacent quantum dot light-emitting units;
   wherein the quantum dot module further comprises a plurality of supporting structures, each supporting structure is located between a corresponding black matrix and the second substrate to define an accommodation space between the corresponding black matrix and the second substrate, and a corresponding optical sensor is located in the accommodation space; and
   wherein the quantum dot module further comprises a plurality of light-shielding structures, each light-shielding structure is located between the corresponding supporting structure and the second substrate, each optical sensor is arranged at a side of the corresponding light-shielding structure away from the light-emitting module, and an orthogonal projection of the optical sensor onto the first substrate is located within an orthogonal projection of the corresponding light-shielding structure onto the first substrate.

2. The display panel according to claim 1, further comprising a retaining wall located between the first substrate and the second substrate, and configured to enclose the light-emitting module.

3. The display panel according to claim 2, further comprising an optically clear adhesive configured to fill a gap among the retaining wall, the light-emitting module and the second substrate.

4. The display panel according to claim 1, wherein the quantum dot module further comprises optical sensors electrically coupled to sensing lines and each configured to detect an intensity of light emitted by a corresponding quantum dot light-emitting unit, and the intensity of the light is used as a basis for compensating for a luminous intensity of the electroluminescent element corresponding to the optical sensor.

5. The display panel according to claim 4, wherein an orthogonal projection of the optical sensor onto the first substrate partially overlaps an orthogonal projection of the quantum dot light-emitting unit onto the first substrate.

6. The display panel according to claim 5, wherein the quantum dot light-emitting units comprise a red quantum dot light-emitting unit, a green quantum dot light-emitting unit and a blue quantum dot light-emitting unit;
a width of an overlapping region between an orthogonal projection of the red quantum dot light-emitting unit onto the first substrate and the orthogonal projection of the corresponding optical sensor onto the first substrate along a row direction of the electroluminescent element is larger than a width of an overlapping region between an orthogonal projection of the green quantum dot light-emitting unit onto the first substrate and the orthogonal projection of the corresponding optical sensor onto the first substrate along the row direction of the electroluminescent element; and/or
a width of an overlapping region between an orthogonal projection of the blue quantum dot light-emitting unit onto the first substrate and the orthogonal projection of the corresponding optical sensor onto the first substrate along the row direction of the electroluminescent element is larger than the width of the overlapping region between the orthogonal projection of the green quantum dot light-emitting unit onto the first substrate and the orthogonal projection of the corresponding optical sensor onto the first substrate along the row direction of the electroluminescent element.

7. The display panel according to claim 1, wherein the quantum dot module further comprises a plurality of supporting structures, each supporting structure is located at a side of a corresponding black matrix away from the second substrate to define an accommodation space at the side of the corresponding black matrix away from the second substrate, and a corresponding optical sensor is located in the accommodation space.

8. The display panel according to claim 7, wherein the quantum dot module further comprises a plurality of light-shielding structures, each light-shielding structure abuts against a surface of a corresponding supporting structure away from the second substrate, each optical sensor is arranged at a side of the corresponding light-shielding structure close to the second substrate, and an orthogonal projection of the optical sensor onto the first substrate is within an orthogonal projection of the corresponding light-shielding structure onto the first substrate.

9. The display panel according to claim 1, wherein the supporting structure is made of a black material.

10. The display panel according to claim 1, wherein an anti-crosstalk structure is further provided at a side of the second substrate close to the first substrate, and an orthogonal projection of a gap between two adjacent quantum dot light-emitting units onto the first substrate is located within an orthogonal projection of the anti-crosstalk structure onto the first substrate.

11. A method for manufacturing a display panel, comprising:
providing a first substrate, and sequentially forming an electroluminescent element and a thin film encapsulation layer on the first substrate;
providing a second substrate, and forming a quantum dot module on the second substrate, the quantum dot module comprising a plurality of quantum dot light-emitting units spaced apart from each other; and
encapsulating the second substrate onto the thin film encapsulation layer,
wherein an orthogonal projection of the thin film encapsulation layer onto the first substrate is located within an orthogonal projection of the second substrate onto the first substrate;
wherein the forming the quantum dot module on the second substrate comprises:
forming light-shielding structures on the second substrate;
forming optical sensors and supporting structures at a side of each light-shielding structure away from the second substrate, an accommodation space between the corresponding black matrix and the second substrate, an orthogonal projection of each optical sensor onto the first substrate and an orthogonal projection of each supporting structure onto the first substrate not overlapping each other and being located within an orthogonal projection of a corresponding light-shielding structure onto the first substrate;
forming a black matrix at a side of each supporting structure away from the second substrate;
forming a corresponding optical sensor in the accommodation space; and
forming each quantum dot light-emitting unit between two adjacent black matrices, an orthogonal projection of each quantum dot light-emitting unit onto the first substrate partially overlapping the orthogonal projection of a corresponding optical sensor, among the optical sensors onto the first substrate; and
wherein the second substrate is configured to support the quantum dot module at a side of a light-emitting module away from the first substrate.

12. The method according to claim 11, wherein the forming the quantum dot module on the second substrate comprises:
forming black matrices and the quantum dot light-emitting units each located between two adjacent black matrices on the second substrate;
providing a third substrate, and forming light-shielding structures on the third substrate;
forming an optical sensor and a supporting structure at a side of each light-shielding structure away from the third substrate, an orthogonal projection of the optical sensor onto the third substrate and an orthogonal projection of the supporting structure onto the third substrate not overlapping each other and being located within an orthogonal projection of the corresponding light-shielding structure onto the third substrate; and
encapsulating the third substrate at a side of each quantum dot light-emitting unit away from the second substrate, the optical sensors, the supporting structures and the light-shielding structures being located between the third substrate and the second substrate, and an orthogonal projection of each quantum dot light-emitting unit onto the second substrate partially overlapping the orthogonal projection of the corresponding optical sensor onto the second substrate.

13. A display device, comprising the display panel according to claim 1.

14. The display panel according to claim 7, wherein the supporting structure is made of a black material.

* * * * *